(12) United States Patent
Liu et al.

(10) Patent No.: US 11,355,047 B2
(45) Date of Patent: Jun. 7, 2022

(54) DISPLAY SUBSTRATE, DISPLAY PANEL, AND DISPLAY DEVICE

(71) Applicant: KUNSHAN GO-VISIONOX OPTO-ELECTRONICS CO., LTD., Kunshan (CN)

(72) Inventors: Quan Liu, Kunshan (CN); Xu Qin, Kunshan (CN); Lu Zhang, Kunshan (CN); Miao Chang, Kunshan (CN); Siming Hu, Kunshan (CN); Zhenzhen Han, Kunshan (CN)

(73) Assignee: KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 0 days.

(21) Appl. No.: 17/239,705

(22) Filed: Apr. 26, 2021

(65) Prior Publication Data

US 2021/0248945 A1   Aug. 12, 2021

Related U.S. Application Data

(63) Continuation of application No. PCT/CN2019/108644, filed on Sep. 27, 2019.

(30) Foreign Application Priority Data

Mar. 29, 2019   (CN) .................... 201910250700.9

(51) Int. Cl.
  *G09G 3/20*   (2006.01)
  *H04N 5/225*   (2006.01)

(52) U.S. Cl.
  CPC ............. *G09G 3/20* (2013.01); *H04N 5/2257* (2013.01); *G09G 2300/0426* (2013.01);
  (Continued)

(58) Field of Classification Search
  CPC ............. G09G 3/20; G09G 2300/0426; G09G 2300/0452; H04N 5/2257
  See application file for complete search history.

(56) References Cited

U.S. PATENT DOCUMENTS

| 2018/0190190 A1 | 7/2018 | Xi et al. |
| 2018/0225500 A1 | 8/2018 | Han |

(Continued)

FOREIGN PATENT DOCUMENTS

| CN | 1877407 A | 12/2006 |
| CN | 105632351 A | 6/2016 |

(Continued)

OTHER PUBLICATIONS

International Search Report of International Application No. PCT/CN2019/108644.

(Continued)

*Primary Examiner* — Sejoon Ahn
(74) *Attorney, Agent, or Firm* — Kilpatrick Townsend & Stockton

(57) ABSTRACT

A display substrate includes a display area and a frame area surrounding at least part of the display area. The display area includes a first display area and a second display area, and a light transmittance of the first display area is greater than a light transmittance of the second display area; the display area is provided with a plurality of pixel groups arranged along a first direction, and each of the pixel groups includes a first sub-pixel group and a second sub-pixel group, or includes only the second sub-pixel group; the first sub-pixel group includes at least one first sub-pixel, and the second sub-pixel group includes at least one second sub-pixel; when multiple sub-pixels are provided in a same pixel group, the multiple sub-pixels are arranged at intervals along a second direction.

20 Claims, 7 Drawing Sheets

(52) U.S. Cl.
CPC ............... *G09G 2300/0452* (2013.01); *G09G 2300/0465* (2013.01); *G09G 2300/0804* (2013.01); *G09G 2320/0233* (2013.01)

(56) References Cited

U.S. PATENT DOCUMENTS

| | | |
|---|---|---|
| 2018/0286322 A1 | 10/2018 | Nade et al. |
| 2019/0074471 A1 | 3/2019 | Abe et al. |
| 2019/0164489 A1 | 5/2019 | Zhang et al. |
| 2019/0326366 A1 | 10/2019 | Fan et al. |
| 2020/0058726 A1 | 2/2020 | Ma et al. |
| 2020/0075680 A1 | 3/2020 | Sun et al. |
| 2020/0075697 A1 | 3/2020 | Xu et al. |
| 2020/0103716 A1 | 4/2020 | Guo et al. |
| 2020/0135817 A1 | 4/2020 | Wang et al. |
| 2020/0234634 A1 | 7/2020 | Li |
| 2020/0273392 A1* | 8/2020 | Chuang ................. G09G 3/2074 |
| 2020/0273394 A1* | 8/2020 | Chen ..................... G09G 3/2074 |
| 2020/0335043 A1 | 10/2020 | Zhao et al. |
| 2021/0183311 A1* | 6/2021 | Kong ..................... G09G 3/3258 |
| 2021/0183317 A1* | 6/2021 | Hu ......................... G09G 3/3233 |
| 2021/0183334 A1* | 6/2021 | Holland ................. G09G 3/3644 |
| 2021/0183927 A1* | 6/2021 | Isobe ................. H01L 27/14618 |

FOREIGN PATENT DOCUMENTS

| | | |
|---|---|---|
| CN | 107633807 A | 9/2017 |
| CN | 107340660 A | 11/2017 |
| CN | 107610635 A | 1/2018 |
| CN | 108010949 A | 5/2018 |
| CN | 207338380 U | 5/2018 |
| CN | 108336117 A | 7/2018 |
| CN | 109143649 A | 9/2018 |
| CN | 108682372 A | 10/2018 |
| CN | 207947007 U | 10/2018 |
| CN | 108766347 A | 11/2018 |
| CN | 109037298 A | 12/2018 |
| CN | 109061975 A | 12/2018 |
| CN | 109192759 A | 1/2019 |
| CN | 109256047 A | 1/2019 |
| CN | 109308866 A | 2/2019 |
| CN | 109315049 A | 2/2019 |
| CN | 208622778 U | 3/2019 |
| EP | 3428967 A1 | 1/2019 |

OTHER PUBLICATIONS

Office Actions of Chinese Patent Application No. 201910250700.9.
Supplementary Partial European Search Report of EP 19923267.

* cited by examiner

DISPLAY SUBSTRATE, DISPLAY PANEL, AND DISPLAY DEVICE

CROSS-REFERENCES TO RELATED APPLICATION

This application is a continuation application of International Application PCT/CN2019/108644, filed on Sep. 27, 2019, which claims priority to Chinese Patent Application No. 201910250700.9, filed on Mar. 29, 2019, entitled "DISPLAY SUBSTRATE, DISPLAY PANEL, AND DISPLAY DEVICE", the disclosure of both application are hereby incorporated by reference in their entirety.

TECHNICAL FIELD

The present disclosure relates to a field of display technology, and particularly to a display substrate, a display panel, and a display device.

BACKGROUND

With the rapid development of electronic devices, users' requirements for screen-to-body ratios are becoming higher and higher, so that full-screen display of electronic devices has attracted more and more attention from the industry. Due to a need to integrate components such as a front camera, an earphone, and an infrared sensing element and the like, conventional electronic devices such as a mobile phone, a tablet computer and the like may be notched in display screens, and the camera, the earphone, the infrared sensing element, and the like may be disposed in the notched area, but a picture cannot be displayed in the notched area. Alternatively, an opening is disposed on the screen. Conventional implementations for front cameras have been inadequate, and therefore new and improved systems and methods are desired.

SUMMARY

According to a first aspect of embodiments of the present disclosure, a display substrate is provided. The display substrate includes a display area and a frame area surrounding at least partial display area, wherein the display area comprises a first display area and a second display area, and a light transmittance of the first display area is greater than a light transmittance of the second display area; the display area is provided with a plurality of pixel groups comprising a plurality of sub-pixels arranged along a first direction, and the plurality of sub-pixels comprise one or more first sub-pixels and one or more second sub-pixels; at least one of the plurality of pixel groups comprises a first sub-pixel group disposed in the first display area and a second sub-pixel group disposed in the second display area, and at least another of the plurality of pixel groups only comprises a second sub-pixel group disposed in the second display area; the first sub-pixel group comprises at least one first sub-pixel; the second sub-pixel group comprises at least one second sub-pixel; when multiple sub-pixels are provided in a same pixel group, the multiple sub-pixels are arranged at intervals along a second direction;

the display area is provided with pixel circuits for driving the sub-pixels; the frame area is provided with one or more emission (EM) signal control circuits, and a number of output terminals of each EM signal control circuit is m, wherein m is an integer greater than 2; and each of the output terminals is electrically connected to at least part of the pixel circuits of the sub-pixels in one of the pixel groups.

In an embodiment, the first sub-pixel group comprises two first sub-pixels, and each of the first sub-pixels is provided with a pixel circuit; the frame area comprises two sub-frame areas located on two opposite sides of the display area; the two sub-frame areas extend in a third direction; each of the two sub-frame areas is provided with an EM signal control circuit corresponding to the first sub-pixel groups; and the pixel circuit of each first sub-pixel in each of the first sub-pixel groups is electrically connected to the EM signal control circuit in one of the two sub-frame areas, the one of the two sub-frame areas is proximate to the each first sub-pixel.

An embodiment of the present disclosure further provides a display panel. The display panel includes the above-mentioned display substrate and a package structure;

the package structure includes a polarizer, and the polarizer covers overlays at least the second display area;

and the polarizer does not cover the first display area.

An embodiment of the present disclosure further provides a display device, including: a device body having a component area;

the above-mentioned display panel, which covers the device body;

where the component area is disposed under the first display area, and the component area is provided with a photosensitive device which emits or collects light passing through the first display area.

In the display substrate, the display panel and the display device provided by the embodiments of the present disclosure, the display area includes the first display area and the second display area, and the light transmittance of the first display area is greater than the light transmittance of the second display area, thus the photosensitive device can be disposed under the first display area, and the external incident light can enter the photosensitive device through the first display area, thereby realizing a full-screen display while ensuring the normal operation of the photosensitive device.

The number of the output terminals of each of the EM signal control circuits disposed in the frame area is m, m is an integer greater than 2, and each output terminal can be electrically connected to at least part of the pixel circuits of the sub-pixels in one pixel group, that is, one EM signal control circuit can control more than two pixel circuits of the sub-pixels in the pixel group, thus reducing the number of EM signal control circuits in the frame area, and reducing a size of the frame area. When a size of the display substrate is constant, the display area can be made larger, which is beneficial to improvement of users' experience.

BRIEF DESCRIPTION OF THE ACCOMPANYING DRAWINGS

DETAILED DESCRIPTION OF THE EMBODIMENTS

As explained above, conventional front camera implementations are inadequate. For an electronic device that implements a function of a camera, external light can enter a photosensitive element disposed under the screen through the opening on the screen. However, these electronic devices are not full-screen in a true sense, and a picture cannot be displayed in all areas of the entire screen, for example, the picture cannot be displayed in the camera area.

Exemplary embodiments which are represented in the accompanying drawings will be described in detail herein. When the following description refers to the accompanying drawings, unless otherwise indicated, same numerals in different accompanying drawings indicate same or similar elements. The embodiments described in the following exemplary embodiments do not represent all embodiments consistent with the present disclosure. Rather, they are merely examples of devices consistent with some aspects of the disclosure described in the appended claims.

As mentioned in the background technology, the notched area is provided on the display screen of the electronic device in the related art, and the photosensitive devices such as the camera, the earpiece, and the infrared sensing element are arranged in the notched area, therefore external light enters the photosensitive devices through the notched area. But the pictures cannot be displayed in the notched area, and the display screen is not full-screen in a true sense. Moreover, driving circuits for driving the display screen, such as an EM signal control circuit, a scanning control circuit and the like are arranged in a frame area surrounding a display area. In the related art, the driving circuit of the electronic device is relatively complicated, resulting in a larger width of the frame area, and when a size of the electronic device is constant, an area of the display area is smaller, which affects the aesthetic of the electronic device and users' experience.

The display substrate, display panel, and display device in the embodiments of the present disclosure will be described in detail below with reference to the accompanying drawings. In a case of no conflict, the following embodiments and features in the embodiments can be mutually supplemented or combined.

Figure 1:
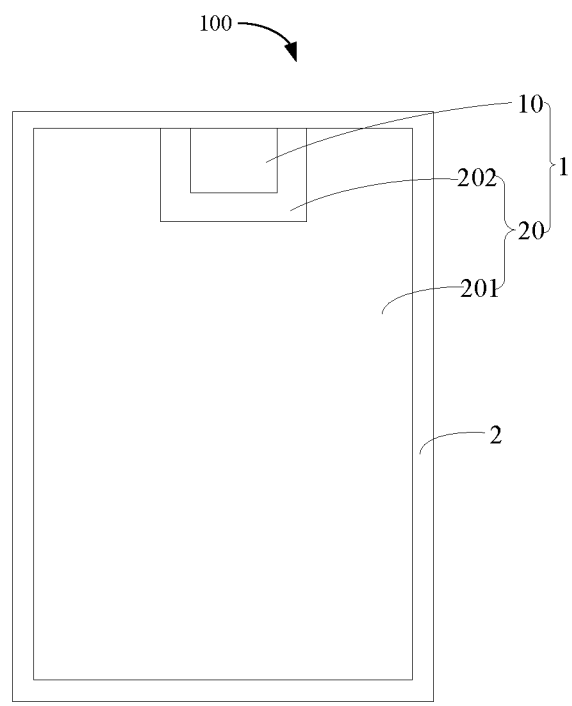
FIG. 1 is a top view illustrating a display substrate of an embodiment of the present disclosure.

An embodiment of the present disclosure provides a display substrate. Referring to FIG. 1, the display substrate 100 includes a display area 1 and a frame area 2 surrounding at least partial display area 1. The display area 1 includes a first display area 10 and a second display area 20. A light transmittance of the first display area 10 is greater than a light transmittance of the second display area 2.

Figure 2:
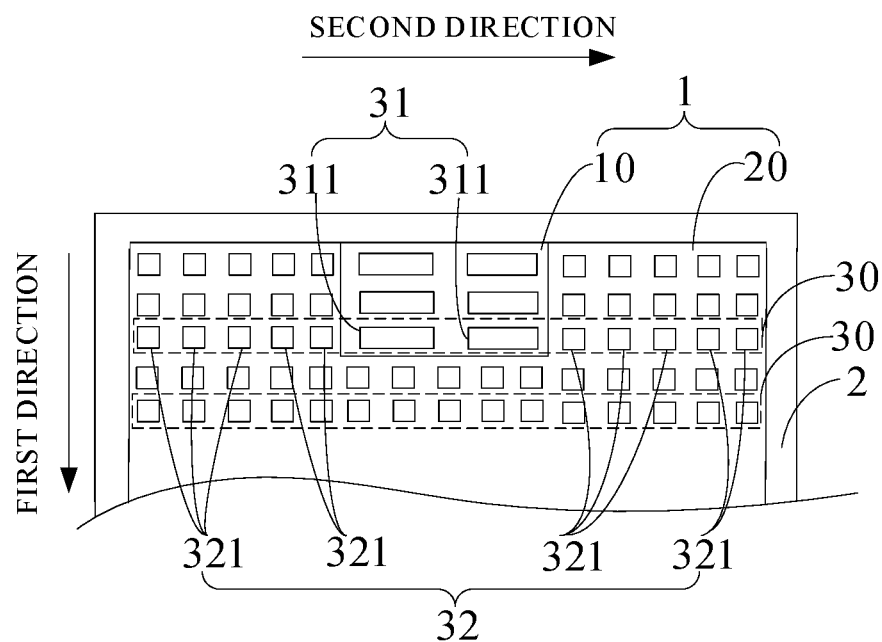
FIG. 2 is a partial schematic view illustrating an embodiment of an arrangement of sub-pixels of the display substrate shown in FIG. 1.

Referring to FIG. 2, the display area 1 is provided with a plurality of pixel groups 30 including a plurality of sub-pixels arranged along a first direction. The plurality of sub-pixels includes one or more first sub-pixels 311 and one or more second sub-pixels 321. At least one of the plurality of pixel groups 30 includes a first sub-pixel group 31 disposed in the first display area 10 and a second sub-pixel group 32 located in the second display area 20. At least another of the plurality of pixel groups 30 only includes the second sub-pixel group 32 located in the second display area 20. The first sub-pixel group 31 includes at least one of the first sub-pixels 311, and the second sub-pixel group 32 includes at least one of the second sub-pixels 321. When the number of the sub-pixels (including the first sub-pixels 311 and the second sub-pixels 321, or consisting of the second sub-pixels 321) in a same pixel group 30 is multiple, the multiple sub-pixels are arranged at intervals along a second direction. A second directional dimension of the first sub-pixel 311 can be greater than a second directional dimension of the second sub-pixel 321 in a same pixel group 30. A first directional dimension of the first sub-pixel 311 can be substantially equal to a first directional dimension of the second sub-pixel 321 in the same pixel group 30. The plurality of pixel groups 30 are arranged at intervals along the first direction.

Figure 3:
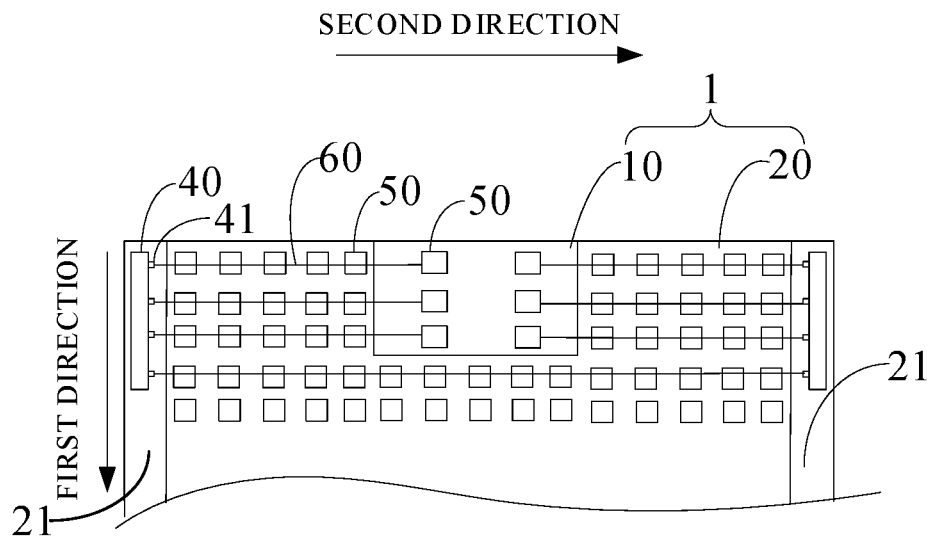
FIG. 3 is a schematic view of an embodiment illustrating connections between pixel circuits and emission (EM) signal control circuits in the display substrate shown in FIG. 1.
Figure 4:
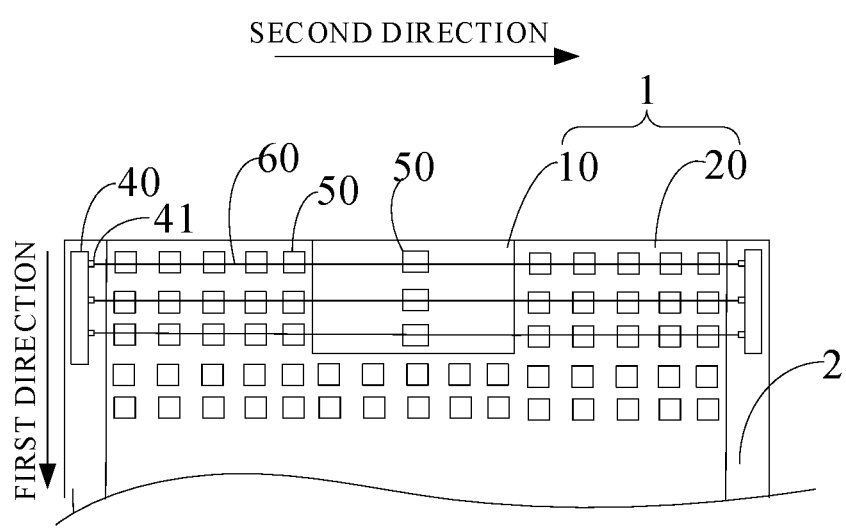
FIG. 4 is a schematic view of another embodiment illustrating the connections between pixel circuits and EM signal control circuits in the display substrate shown in FIG. 1.
Figure 5:
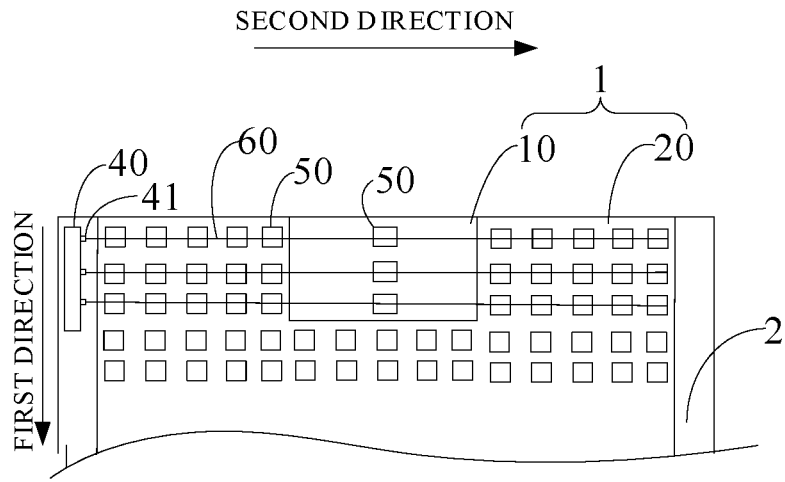
FIG. 5 is a schematic view of another embodiment illustrating the connections between pixel circuits and EM signal control circuits in the display substrate shown in FIG. 1.

Referring to FIGS. 3 to 5, the display area 1 is provided with pixel circuits 50 for driving sub-pixels in the display area 1; the frame area 2 is provided with one or more EM signal control circuits 40; and the number of output terminals of each EM signal control circuit 40 is m, where m is an integer greater than 2. Each of the output terminals 41 is electrically connected to at least part of the pixel circuits 50 of the sub-pixels in one of the pixel group 30.

The EM signal control circuit 40 is configured to provide a light emitting signal to the pixel circuit 50, and the pixel circuit 50 controls the corresponding sub-pixel thereof to emit light after the pixel circuit 50 receives the light emitting signal provided by the EM signal control circuit 40. The EM signal control circuit 40 arranged in the frame area 2 can be connected to the sub-pixels in the same pixel group 30 through a wire 60.

In the display substrate 100 provided by the embodiments of the present disclosure, the display area 1 includes the first display area 10 and the second display area 20, and the light transmittance of the first display area 10 is greater than the light transmittance of the second display area 20, thus the photosensitive device can be disposed under the first display area 10, and the external incident light can enter the photosensitive device through the first display area 10, thereby realizing a full-screen display of the display substrate 100 while ensuring the normal operation of the photosensitive device. The number of the output terminals 41 of each EM signal control circuit 40 in the frame area 2 is m, where m is an integer greater than 2, and each output terminal 41 can be electrically connected to at least part of the pixel circuits of the sub-pixels in one pixel group 30, that is, one EM signal control circuit 40 can control the pixel circuits of the sub-pixels in more than two (for example, three, four, five, etc.) pixel groups, thus reducing the number of the EM signal control circuits 40 in the frame area 2, and reducing a size of the frame area 2. When a size of the display substrate 100 is constant, the display area 1 can be made larger, which is beneficial to improvement of users' experience.

Referring to FIG. 3 again, the frame area 2 can include two sub-frame areas 21 located on two opposite sides of the display area 1, and the two sub-frame areas 21 can extend along a third direction. The EM signal control circuit 40 can be disposed in the two sub-frame areas 21. The third direction can be identical to or different from the first direction.

FIGS. 3 to 5 illustrate the embodiments by taking a case that the pixel circuit 50 of the first sub-pixel 311 in the first display area 10 is arranged only in the first display area 10 as an example. In other embodiments, the pixel circuit 50 of the first sub-pixel 311 in the first display area 10 may be disposed in the second display area 20.

Figure 6:
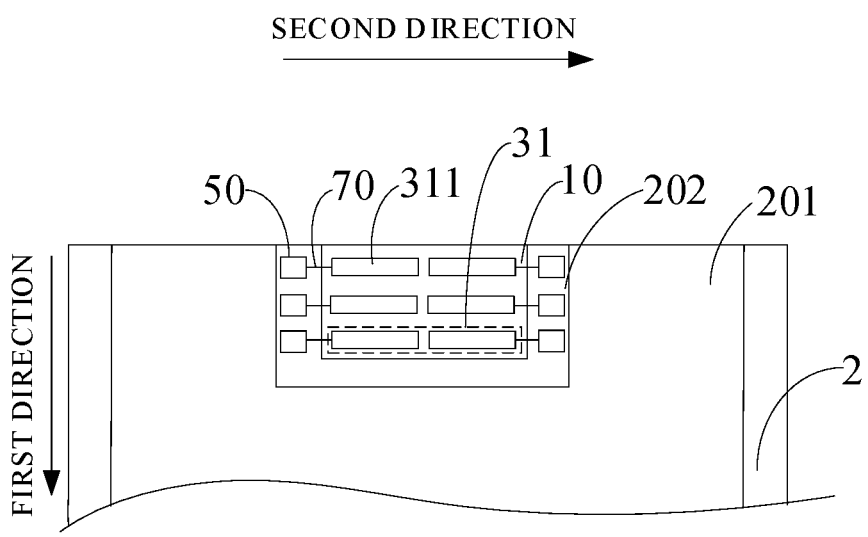
FIG. 6 is a schematic view of an embodiment illustrating an arrangement of first pixels in a first display area 10 and pixel circuits of the first pixels in the display substrate shown in FIG. 1.
Figure 7:
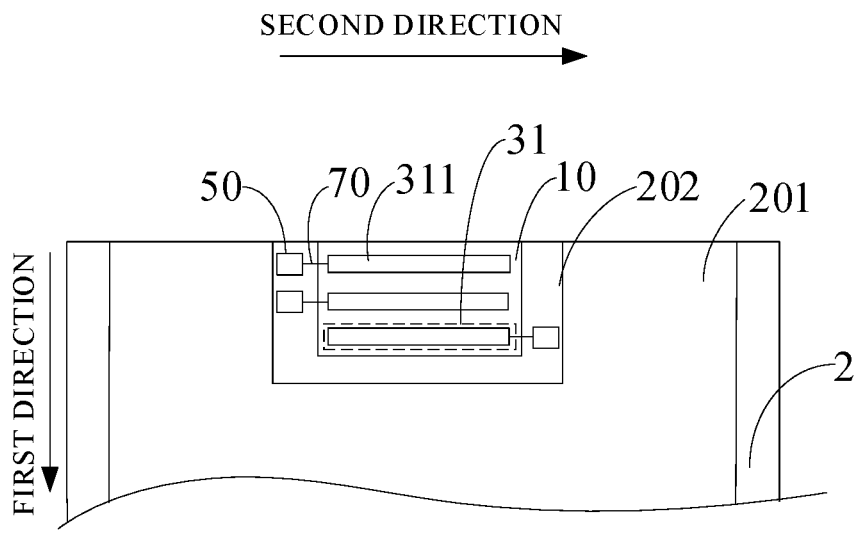
FIG. 7 is a schematic view of another embodiment illustrating the arrangement of the first pixels in the first display area 10 and the pixel circuits of the first pixels in the display substrate shown in FIG. 1.
Figure 8:
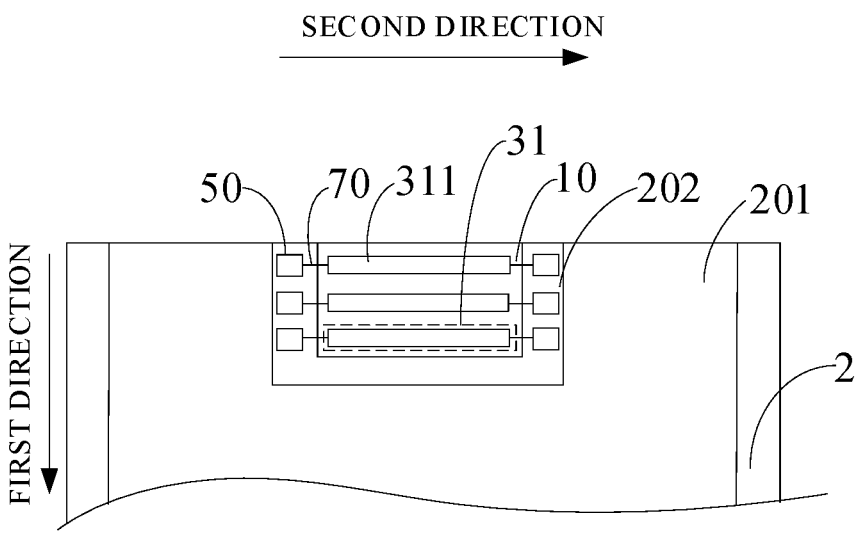
FIG. 8 is a schematic view of another embodiment illustrating the arrangement of the first pixels in the first display area 10 and the pixel circuits of the first pixels in the display substrate shown in FIG. 1.

In an embodiment, referring to FIG. 1 again, the second display area 20 includes a first area 201, and a second area 202 adjacent to the first area 201 and the first display area 10, and the second area 202 surrounds at least partial first display area 10. In an embodiment, one side of the first display area 10 coincides with one edge of the display area 1, for example, with a top edge of the display area 1, and the second area 202 surrounds other three sides of the first display area 10. In another embodiment, the first display area 10 is disposed within the display area 1, and the second area 202 surrounds four sides of the first display area 10. The top of the display area 1 may be provided with the frame area or not. Referring to FIGS. 6 to 8, the pixel circuit 50 of the first sub-pixel 311 in the first sub-pixel group 31 can be disposed in the second area 202. The first sub-pixel 311 and the pixel circuit 50 thereof can be electrically connected through a wire 70.

Such an arrangement can reduce a structural complexity of the first display area 10, and improve the light transmittance of the first display area 10, thereby reducing diffraction generated when the external incident light passes through the first display area 10. Further, the pixel circuit 50 of each first sub-pixel 311 in the first sub-pixel group 31 is disposed in a region of the second area 202, which is adjacent to the corresponding first sub-pixel 311, so that the wire connecting the first sub-pixel 311 with the pixel circuit 50 thereof is shortened.

In an embodiment, referring to FIG. 6, the first sub-pixel group 31 includes two first sub-pixels 311; each sub-pixel 311 is provided with one pixel circuit 50; and the pixel circuit 50 of each first sub-pixel 311 is disposed in a region of the second area 202, which is adjacent to the corresponding first sub-pixel 311.

In another embodiment, referring to FIG. 7, the first sub-pixel group 31 includes one first sub-pixel 311. The first sub-pixel 311 is provided with one pixel circuit 50, and the pixel circuit 50 of the first sub-pixel 311 is disposed in a region of the second area 202, which is located on either side of the first sub-pixel 311.

In another embodiment, referring to FIG. 8, the first sub-pixel group 31 includes one first sub-pixel 311. The first sub-pixel 311 is provided with two pixel circuits 50, and the two pixel circuits 50 of the first sub-pixel 311 are disposed in two regions of the second area 202 respectively, which are located on two sides of the first sub-pixel 311.

In an embodiment, referring to FIGS. 2 and 3, the first sub-pixel group 31 includes two first sub-pixels 311. Each first sub-pixel 311 can correspond to one pixel circuit 50. Each of the two sub-frame areas 21 is provided with the EM signal control circuit 40 corresponding to the first sub-pixel groups 31. The pixel circuit 50 of each first sub-pixel 311 in each of the first sub-pixel groups 31 is electrically connected to the EM signal control circuit 40 in one of the two sub-frame area 21, where the one of the two sub-frame areas is proximate to the each first sub-pixel 311. As shown in FIG. 3, the pixel circuit 50 of the first sub-pixel 311 located on a left side is connected to the EM signal control circuit 40 in the sub-frame area 21 which is disposed on a left side of the display area 1, and the pixel circuit 50 of the first sub-pixel 311 located on a right side is connected to the EM signal control circuit 40 in the sub-frame area 21 which is disposed on a right side of the display area 1.

In such an arrangement, when the pixel circuit 50 of the first sub-pixel 311 in the first sub-pixel group 31 is arranged in a region of the second display area 20, which is adjacent to the first sub-pixel 311, an end, proximate to the second display area 20, of the first sub-pixel 311, can be electrically connected to the pixel circuit 50 thereof, and a connecting line between the first sub-pixel 311 and the pixel circuit 50 thereof is relatively short. Moreover, the pixel circuit 50 of the first sub-pixel 311 can be electrically connected to the corresponding EM signal control circuit 40 through the wire disposed in the second display area 20 without a need to introduce the wire into the first display area 10. When the pixel circuit 50 of the first sub-pixel 311 in the first sub-pixel group 31 is disposed under the first sub-pixel 311, since the pixel circuit 50 of the first sub-pixel 311 is electrically connected to the EM signal control circuit 40 disposed in the sub-frame area 21 adjacent to the corresponding first sub-pixel 311, the wire 60 connected between the pixel circuit 50 of the first sub-pixel 311 and the EM signal control circuit 40 is relatively short. Two above-mentioned configuration modes of the pixel circuit 50 of the first sub-pixel 311 can reduce the complexity of the circuit in the first display area 10, thereby improving the light transmittance of the first display area 10, and reducing the diffraction generated when the external incident light passes through the first display area 10.

Further, referring to FIGS. 2 and 3, among the first sub-pixel 311 and the second sub-pixel 321 in the same pixel group 30, the pixel circuit 50 of the second sub-pixel 321 arranged between the first sub-pixel 311 and the sub-frame area 21 proximate to the first sub-pixel 311, and the pixel circuit 50 of the first sub-pixel 311, are electrically connected to a same output terminal 41 of a same EM signal control circuit 40. The sub-frame area 21 proximate to the first sub-pixel 311 refers to one of the two sub-frame areas 21, which is proximate to the corresponding first sub-pixel 311. With such an arrangement, the pixel circuit of the second sub-pixel 321 between the first sub-pixel 311 and the sub-frame area 21 proximate to the corresponding first sub-pixel 311, and the pixel circuit of the corresponding first sub-pixel 311 can be connected to the output terminal 41 of the corresponding EM signal control circuit 40 through one wire, which can reduce a length of the wire and is conducive to simplifying complexity of the wiring in the display area 1.

The two sub-frame areas 21 can be provided with a scanning control circuit respectively, and the pixel circuit 50 of each first sub-pixel 311 in the first sub-pixel group 31 is electrically connected to the scanning control circuit located in the sub-frame area 21 proximate to the corresponding first sub-pixel 311. The scanning control circuit is configured to provide a scanning signal to the pixel circuit, and the scanning control circuit is electrically connected to the pixel circuit through a grid line.

In such an arrangement, when the pixel circuit 50 of the first sub-pixel 311 in the first sub-pixel group 31 is disposed in a region of the second display area 20, which is proximate to the corresponding first sub-pixel 311, the terminal of the corresponding first sub-pixel 311, which is adjacent to the second area 202, can be electrically connected to the pixel circuit 50, and the connecting line between the corresponding first sub-pixel 311 and the pixel circuit 50 thereof is shorter. Moreover, the pixel circuit 50 of the first sub-pixel 311 can be electrically connected to the corresponding scanning control circuit through the grid line disposed in the second display area 20 without a need to introduce the grid line into the first display area 10. When the pixel circuit 50 of the first sub-pixel 311 in the first sub-pixel group 31 is disposed under the first sub-pixel 311, since the pixel circuit 50 of the first sub-pixel 311 is electrically connected to the scanning control circuit disposed within the sub-frame area 21 adjacent to the corresponding first sub-pixel 311, the grid line between the pixel circuit 50 of the first sub-pixel 311 and the scanning control circuit is shorter. The two above-mentioned configuration modes of the pixel circuit 50 of the first sub-pixel 311 can reduce the complexity of arrangement of the grid line in the first display area 10, thereby improving the light transmittance of the first display area 10, and reducing the diffraction generated when the external incident light passes through the first display area 10.

Further, among the first sub-pixels 311 and the second sub-pixels 321 in the same pixel group 30, the pixel circuit 50 of the second sub-pixel 321 between the first sub-pixel 311 and the sub-frame area 21 proximate to the first sub-pixel 311, and the pixel circuit 50 of the corresponding first sub-pixel 311 are electrically connected to a same scanning control circuit. In such an arrangement, the pixel circuit 50 of the second sub-pixel 321 between the first sub-pixel 311 and the sub-frame area 21 proximate to the corresponding first sub-pixel 311, and the pixel circuit 50 of the corresponding first sub-pixel 311 can be electrically connected to the corresponding scanning control circuit through the grid line, which can reduce a length of the grid line and is conducive to simplification of the wiring in the display area 1.

In another embodiment, referring to FIG. 5, each first sub-pixel group 31 includes one first sub-pixel 311. The first sub-pixel is provided with one pixel circuit 50. One of the two sub-frame areas 21 is provided with the EM signal control circuit 40 corresponding to the first sub-pixel group 31. The pixel circuit 50 of the first sub-pixel 311 in the first sub-pixel group 31 is electrically connected to the output terminal of the corresponding EM signal control circuit. With such an arrangement, the EM signal control circuit 40 is only disposed in one sub-frame area 21 to drive the pixel circuit 50 of the first sub-pixel in the first display area 10, which can simplify the number of the EM signal control circuits in the sub-frame area 21 and is conducive to reduction of the width of the sub-frame area 21.

Furthermore, referring to FIG. 5, the pixel circuit 50 of the first sub-pixel 311 and the pixel circuit 50 of the second sub-pixel 321 are connected to the same output terminal of the same EM signal control circuit 40, in which the first sub-pixel 311 and the second sub-pixel 321 are in the same pixel group 30. With such an arrangement, the pixel circuit 50 of the first sub-pixel 311 and the pixel circuit 50 of the second sub-pixel 321 can be connected to the output terminal 41 of the corresponding EM signal control circuit 40 through one wire, in which the first sub-pixel 311 and the second sub-pixel 321 are in the same pixel group 30, which can reduce the complexity of the wiring.

In another embodiment, referring to FIG. 8, each first sub-pixel group 31 can include one first sub-pixel 311. The first sub-pixel 311 is provided with two pixel circuits 50. Two EM signal control circuits 40 corresponding to the first sub-pixel group 311 are provided in two sub-frame areas 21 respectively. The two pixel circuits 50 of the first sub-pixel 311 in the first sub-pixel group 31 are electrically connected to the two EM signal control circuits 40 one-to-one.

In such an arrangement, when two pixel circuits 50 of the first sub-pixel 311 in the first sub-pixel group 31 are disposed in the regions of the second display area 20, which are adjacent to the first sub-pixel 311, two terminals of the first sub-pixel 311 can be electrically connected to the two pixel circuits 50 one-to-one, and the connecting line between the first sub-pixel 311 and each pixel circuit 50 is relatively short. Moreover, the pixel circuits 50 of the first sub-pixel 311 can be electrically connected to the corresponding EM signal control circuits 40 through the wire 60 disposed in the second display area 20 without a need to introduce the wire 60 into the first display area 10. When two pixel circuits 50 of the first sub-pixel 311 in the first sub-pixel group 31 are disposed under the first sub-pixel 311, each pixel circuit 50 can be electrically connected to the EM signal control circuit 40 disposed in the sub-frame area 21, which is proximate to the corresponding pixel circuit 50, so that the wire 60 between the pixel circuit of the first sub-pixel 311 and the EM signal control circuit 40 is relatively short. The two above-mentioned configuration modes of the pixel circuits 50 of the first sub-pixel 311 can reduce the complexity of the wiring in the first display area 10, thereby improving the light transmittance of the first display area 10, and reducing the diffraction generated when the external incident light passes through the first display area 10. Moreover, the first sub-pixel 311 is provided with two pixel circuits 50, which can reduce the delay of a control signal and is conducive to improvement of the display effect.

Further, referring to FIGS. 2 and 3, in the same pixel group 30, the pixel circuit 50 of the second sub-pixel 321 between the first display area 10 and any one sub-frame area 21, and the pixel circuit 50 of the first sub-pixel 311 proximate to the one sub-frame area 21, are connected to the same output terminal 41 of the EM signal control circuit 40 disposed in the adjacent sub-frame area 21. With such an arrangement, two types of pixel circuits, namely the pixel circuit 50 of the first sub-pixel 311, and the pixel circuit 50 of the second sub-pixel 321 located between the pixel circuit 50 of the first sub-pixel 311 and the sub-frame area 21 proximate to the pixel circuit 50 of the first sub-pixel 311, can be electrically connected to the same output terminal of the EM signal control circuit 40, therefore a layout of the wires 60 can be simplified and a process flow of preparing the display substrate 100 is simplified.

Furthermore, scanning control circuits are arranged in the two sub-frame areas 21 respectively. The pixel circuits 50 of all the second sub pixels 321 between the first display area 10 and any one sub-frame area 21, and the pixel circuit 50 of the first sub-pixel 311, which is proximate to the sub-frame area 21, are connected to the same scanning control circuit in the sub-frame area through a grid line. Such an arrangement can simplify the layout of the grid lines and simplify the preparation process.

In the display substrate 100 shown in FIG. 2, the first directional dimension of the first sub-pixel 311 and the first directional dimension of the second sub-pixel 321 in each pixel group 30 are roughly identical. No other second sub-pixels are arranged between two adjacent second sub-pixel groups 32 in the first direction. However, the arrangement of the first sub-pixels 311 and the second sub-pixels 321 of the display substrate 100 is not limited to this, and they can also be arranged as shown in FIG. 9.

Figure 9:
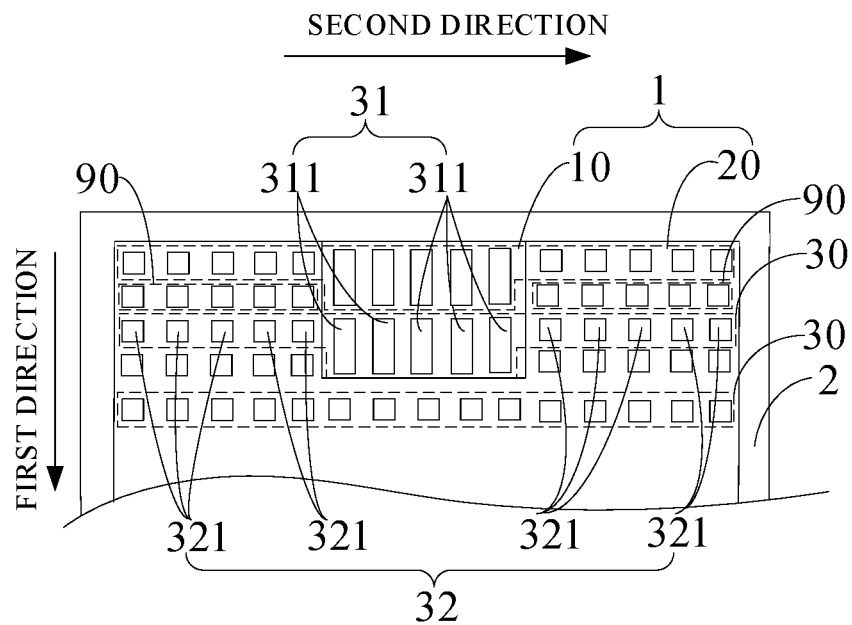
FIG. 9 is a partial schematic view of another embodiment illustrating the arrangement of sub-pixels of the display substrate shown in FIG. 1.

Referring to FIG. 9, a distribution density of the first sub-pixels 311 in the first display area 10 (that is, the number of sub-pixels per unit area) is smaller than a distribution density of the second sub-pixels 321 in the second display area 20. In the same pixel group 30, the first directional dimension of the first sub-pixel 311 is larger than the first directional dimension of the second sub-pixel 321. The second display area 20 further includes at least one third sub-pixel group 90 disposed between two adjacent second sub-pixel groups 32, and the third sub-pixel group 90 includes at least one second sub-pixel 321. When the third sub-pixel group 90 includes a plurality of second sub-pixels 321, the plurality of second sub-pixels 321 are arranged at intervals and spaced by the first sub-pixel group 31 along the second direction.

In the display substrate 100 shown in FIG. 9, in the first direction, a third sub-pixel group 90 is arranged between two adjacent second sub-pixel groups 32. In other embodiments, two or more third sub-pixel groups 90 are provided between two adjacent second sub-pixel groups 32 along the first direction.

In an embodiment, among the second sub-pixels 321 in the third sub-pixel group 90 and the second sub-pixels 321 in the second sub-pixel groups 32 adjacent to the third sub-pixel group 90, the pixel circuits 50 of the second sub-pixels 321, which include the second sub-pixels 321 arranged between one of the two sub-frame areas 21 and the first display area 10, in the second sub-pixel groups 32, and include the second sub-pixels 321 arranged between the one of the two sub-frame areas 21 and the first display area 10, in the third sub-pixel group 90, are electrically connected to a same output terminal of a same EM signal control circuit 40 or connected to different output terminals of the same EM signal control circuit 40. For example, as shown in FIG. 9, the pixel circuits 50 of the second sub-pixels 321 in the third sub-pixel group 90 on the left side of the first display area 10 and the pixel circuits 50 of the second sub-pixels 321 in the second sub-pixel group 32 adjacent to the corresponding third sub-pixel group 90, which is located on the left side of the first display area 10, can be connected to the same output terminal of the same EM signal control circuit 40 or connected to different output terminals of the same EM signal control circuit 40. The second sub-pixel group 32 adjacent to the third sub-pixel group 90 can be the second sub-pixel group 32 arranged above the third sub-pixel group 90, or may be the second sub-pixel group 32 arranged below the third sub-pixel group 90.

In such an arrangement, the same EM signal control circuit 40 can simultaneously drive the pixel circuits 50 of the sub-pixels in multiple pixel groups and in the third sub-pixel group 90 adjacent to the pixel group, which can further reduce the number of the EM signal control circuits in the frame area, thereby reducing the dimension of the frame area.

The pixel circuit of the second sub-pixel 321 in the third sub-pixel group 90 and the pixel circuit of the second sub-pixel 321 in the second sub-pixel group 32 adjacent to the third sub-pixel group 90 can also be connected to different EM signal control circuits 40.

In an embodiment, a distribution density of the second sub-pixels 321 in the second area 202 is greater than the distribution density of the first sub-pixels in the first display area 10, and is less than the distribution density of the second sub-pixels 321 in the first area 201. In such an arrangement, when the display substrate 100 displays something, brightness of the second area 202 is between brightness of the first area 201 and that of the first display area 10, which can avoid a problem of obvious demarcation line caused by a larger brightness difference between the first display area 10 and the second area 202 when they are arranged to be adjacent to each other, and is conducive to improvement of the users' experiences.

In an the embodiments, a distance between two adjacent second sub-pixels 321 in the second area 202 is less than a distance between two adjacent first sub-pixels 311 in the first display area 10; and/or, a size of the second sub-pixel 321 in the second area 202 is less than a size of the first sub-pixel 311 in the first display area 10. Such an arrangement can make the distribution density of the second sub-pixels 321 in the second area 202 greater than the distribution density of the first sub-pixels 311 in the first display area 10.

In an embodiment, the pixel circuit of each first sub-pixel 311 and each second sub-pixel 321 can be a circuit including three transistors and one capacitor, or a circuit including three transistors and two capacitors, or a circuit including seven transistors and one capacitor, or a circuit including seven transistors and two capacitors.

In an embodiment, an arrangement manner of the second sub-pixels 321 in the second display area 20 can be identical to an arrangement manner of the first sub-pixels 311 in the first display area 10, so that a display effect of the second display area 20 and a display effect of the first display area 10 are more consistent.

In an embodiment, the first sub-pixel 311 in the first sub-pixel group 31 includes a first electrode, a first light-emitting structure block disposed on the first electrode, and a second electrode disposed on the first light-emitting structure block. The first electrode of each first sub-pixel includes at least one first electrode block.

Figure 10:
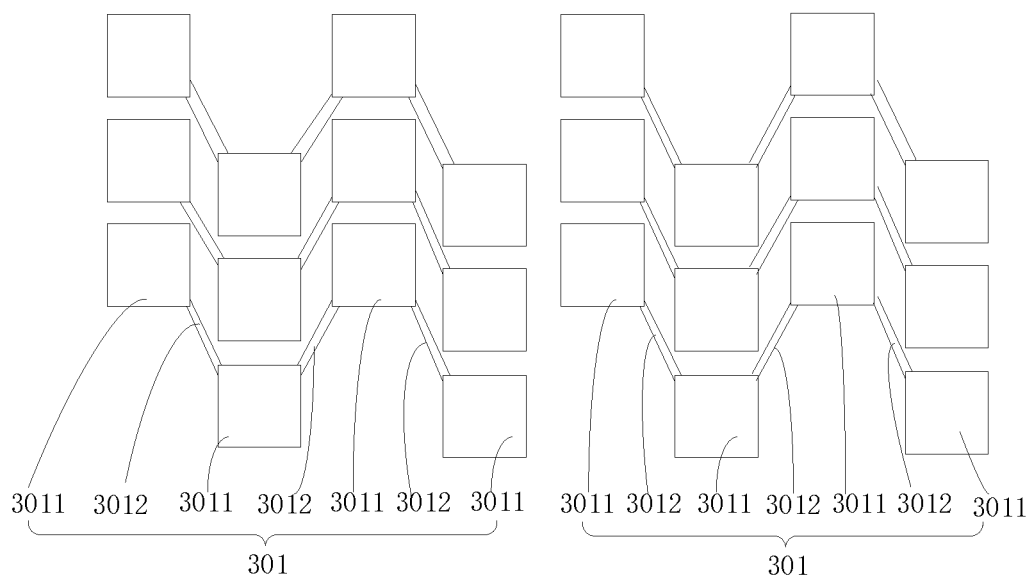
FIG. 10 is a schematic view of an embodiment illustrating projections of first electrodes on the substrate in the display substrate shown in FIG. 1.
Figure 11:
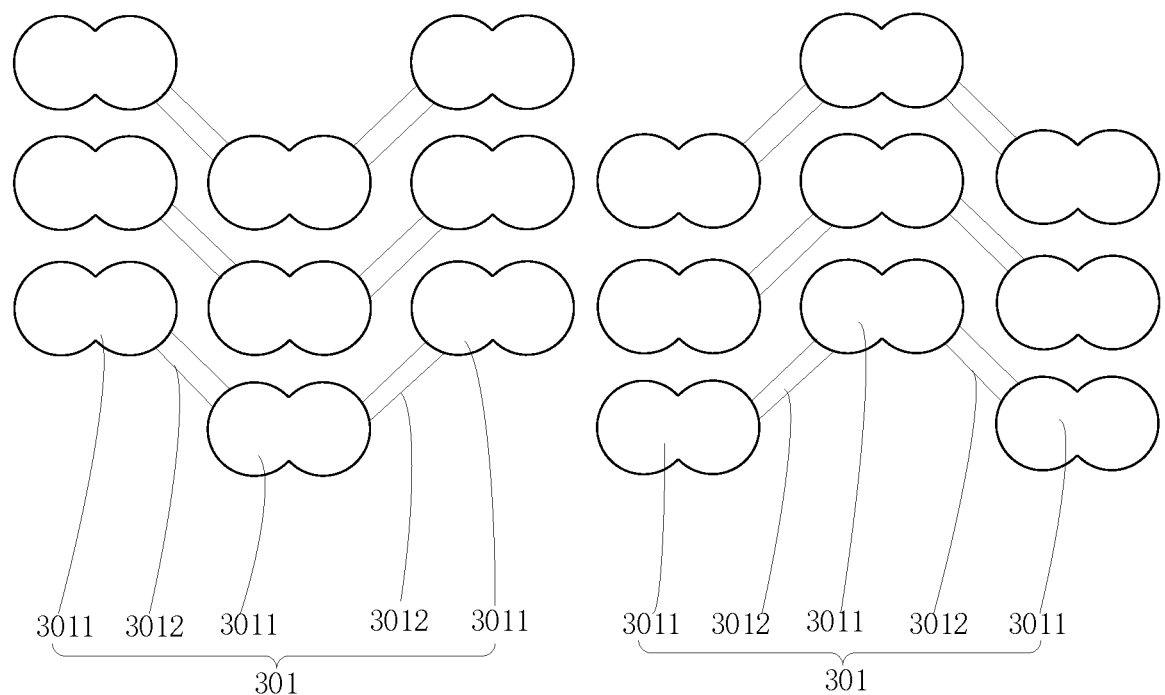
FIG. 11 is a schematic view of another embodiment illustrating the projections of the first electrodes on the substrate in the display substrate shown in FIG. 1.
Figure 12:
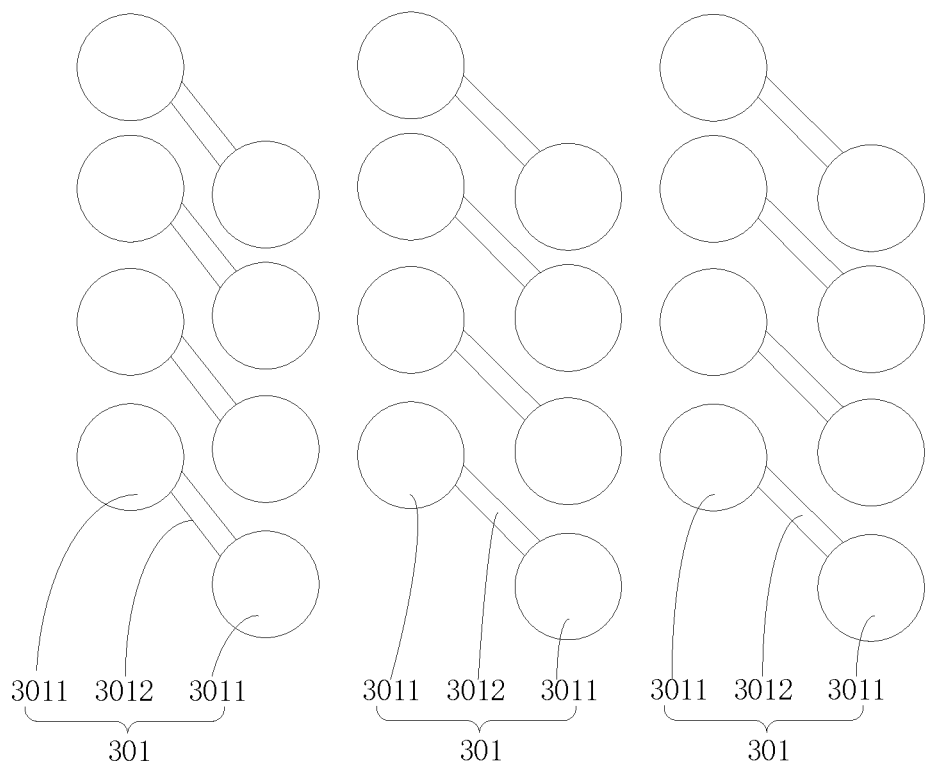
FIG. 12 is a schematic view of another embodiment illustrating the projections of the first electrodes on the substrate in the display substrate shown in FIG. 1.

In an embodiment, referring to FIGS. 10 to 12, the first electrode 301 of one first sub-pixel 311 includes two or more first electrode blocks 3011; the first electrode 301 further includes a connecting portion 3012 disposed between two adjacent first electrode blocks 3011; and two adjacent first electrode blocks 3011 are electrically connected by the corresponding connecting portion 3012.

When the connecting portion 3012 and the first electrode block 3011 are disposed on a same layer, a dimension of the connecting portion 3012, which is in a planar parallel to the display substrate 100 and in a direction perpendicular to an extension direction of the connecting portion 3012, is greater than 3 µm and less than a half of a maximum dimension of the first electrode block 3011. A resistance of the connecting portion 3012 can be relatively small by configuring the dimension of the connecting portion 3012 in the direction perpendicular to the extension direction thereof greater than 3 μm; and an arrangement of the connecting portion 3012 can have less influence on the size of the first electrode block 3011 by configuring the dimension of the connecting portion 3012 less than a half of the maximum size of the first electrode block 3011, thereby avoiding a decrease in the size of the first electrode block 3011 and a decrease in an effective light-emitting area of the first display area 10 due to the relatively large dimension of the connecting portion 3012.

In an embodiment, the first direction is perpendicular to the second direction, and the first direction is a row direction or a column direction. The plurality of the first electrodes 301 may be arranged in one row and multiple columns, or one column and multiple rows, or two columns and multiple rows, or two rows and multiple columns, or multiple rows and multiple columns. In FIGS. 10 to 12 illustrate the embodiments by taking the column direction being the first direction and the row direction being the second direction as an example. In other embodiments, the first direction may also be the row direction, and the second direction is the column direction.

In an embodiment, among the first electrode blocks 3011 of the first sub-pixels 311 in the same first sub-pixel group 31, two adjacent first electrode blocks 3011 are staggered in the second direction. Such an arrangement can further reduce the diffraction effect generated when the external incident light passes through the first display area 10.

Further, among the first electrode blocks 3011 of the first sub-pixels 311 in the same first sub-pixel group 31, the second directional central axes of two first electrode blocks 3011 arranged and spaced by one first electrode block 3011 coincide with each other. In such an arrangement, an arrangement of the plurality of the first electrode blocks 3011 in the first sub-pixel group is more regular, so that an arrangement of the first light-emitting structure blocks correspondingly arranged on the plurality of first electrode blocks 3011 is more regular, and then an arrangement of openings of a mask used to fabricate the light-emitting structural blocks is relatively regular. In addition, when the light-emitting structure is vapor-deposited, the first light-emitting structure blocks in the first display area and the second display area of the display substrate 100 can be fabricated in a same vapor deposition process using a same mask. Since the patterns on the mask are more regular, net folds are also reduced.

In an embodiment, the display substrate 100 includes a substrate; the first electrode block 3011 is disposed on the substrate; and a projection of the first electrode block 3011 on the substrate consists of one or more first graphic units. The first graphic unit can be a circle, an ellipse, dumbbell-shaped, gourd-shaped, or a rectangle.

As shown in FIG. 10 to FIG. 11, each of the first sub-pixel groups includes two first electrodes 301, and each first electrode 301 includes a same number of first electrode blocks 3011. Each of the sub-pixel groups shown in FIG. 12 includes three first electrodes 301, and each first electrode 301 includes a same number of first electrode blocks 3011. As shown in FIG. 10, the projection of each first electrode block 3011 on the substrate consists of the first graphic unit, which is a rectangle. As shown in FIG. 11, the projection of each first electrode block 3011 on the substrate consists of the first graphic unit, which is gourd-shaped. As shown in FIG. 12, the projection of each first electrode block 3011 on the substrate consists of the first graphic unit, which is a circle. In an embodiment, the first graphic unit is a circle, an oval, dumbbell-shaped, or gourd-shaped. In such an arrangement, the first directional dimension of the first electrode 301 changes continuously or discontinuously, therefore a first directional distance between two adjacent first electrodes 301 in the first direction changes continuously or discontinuously, so that positions where diffraction of the two adjacent first electrodes 301 is generated are different. The diffraction effects at different positions cancel each other out, thereby reducing the diffraction effects effectively, and ensuring that images captured by the camera disposed under the first display area 10 have relatively high definition.

In an embodiment, the light-emitting structure includes a first light-emitting structure block correspondingly disposed on each first electrode block 3011, and a projection of the first light-emitting structure block on the substrate consists of one or more second graphic units. The second graphic unit is a circle, an oval, dumbbell-shaped, gourd-shaped, or a rectangle. The first graphic unit and the second graphic unit may be identical or different. In an embodiment, the first graphic unit and the second graphic unit are different, so as to further reduce the diffraction effect generated when light passes through the first display area 10.

In an embodiment, the first display area 10 can be a transparent display area, and a photosensitive device such as a camera can be disposed under the first display area 10. The light transmittance of the first display area 10 is relatively large, for example, greater than 70%, so as to meet the lighting requirements of the photosensitive device.

In order to increase the light transmittance of the first display area 10, materials of each layer in the first display area 10 can be transparent materials. In such an arrangement, a lighting effect of the photosensitive device, such as a camera, disposed under the first display area 10 can be improved.

In an embodiment, materials of the first electrode and/or the second electrode disposed in the first display area 10 are both transparent materials. Further, the light transmittance of the transparent materials of the first electrode and/or the second electrode in the first display area 10 is greater than or equal to 70%. In an embodiment, the light transmittance of the transparent materials is greater than or equal to 90%, for example, the light transmittance of the transparent materials can be 90%, 95%, or the like. Such an arrangement can make the light transmittance of the first display area 10 relatively large, so that the light transmittance of the first display area 10 meets the lighting requirements of the photosensitive device disposed under the first display area.

Furthermore, the transparent material used for preparing the first electrode and/or the second electrode disposed in the first display area 10 includes at least one of indium tin oxide, indium zinc oxide, silver-doped indium tin oxide, and silver-doped indium zinc oxide. In an embodiment, the transparent material used for preparing the first electrode and/or the second electrode in the first display area 10 is silver-doped indium tin oxide or silver-doped indium zinc oxide, so as to reduce the resistance of the first electrode and/or the second electrode under the condition of ensuring the high light transmittance of the first display area 10.

Figure 13:
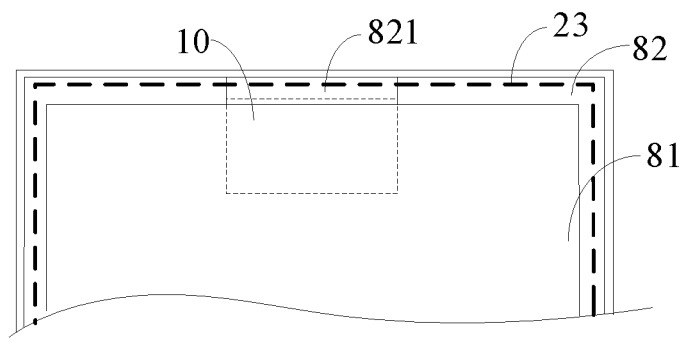
FIG. 13 is a schematic view of an embodiment illustrating a connection between a planar electrode and a low-level power signal line via a conductive layer in the display substrate shown in FIG. 1.

In an embodiment, the second sub-pixel 321 in the second display area 20 includes a third electrode, a second light-emitting structure block disposed on the third electrode, and a fourth electrode disposed on the second light-emitting structure block. Referring to FIG. 13, the second electrode of each of the first sub-pixels in the first display area 10 and the fourth electrode of each of the second sub-pixels in the second display area 20 are connected together as a planar electrode 81.

Referring to FIG. 13, a low-level power signal line 23 is arranged in the frame area 2 and surrounds the display area.

The low-level power signal line 23 is electrically connected to the planar electrode 81 in the display area 1 to provide power signals for the first sub-pixel and the second sub-pixel in the display area 1.

The display substrate 100 is further provided with a conductive layer 82. The first display area 10 adjoins the frame area 2, and the low-level power signal line 23 and the planar electrode 81 are bridged by the conductive layer 82, thereby realizing an electrical connection between the low-level power signal line 23 and the planar electrode 81. A material of the region 821 of the conductive layer 82 adjacent to the first display area 10 is a transparent conductive material. Or, no low-level power signal line is arranged in the region of the frame area adjacent to the first display area.

In such an arrangement, since the transparent conductive material has better light transmittance, when the material of the region 821 adjacent to the first display area 10 is a transparent material, compared with a metal material, the material of the region 821 of the conductive layer 82 proximate to the first display area 10 can be protected from reflecting light and prevented from causing poor display effect of the first display area 10 and poor imaging effect of the camera disposed under the first display area 10. When no low-level power signal line 23 is arranged in the region of the frame area 2, which is proximate to the first display area 10, there is no need to provide the conductive layer in this region to bridge the low-level power signal line 23 and the planar electrode 81. Accordingly, when external light strikes the region, no reflected light occurs, which can prevent the region 821 of the conductive layer 82, which is proximate to the first display area 10, from reflecting light and causing poor display effect of the first display area 10 and poor imaging effect of the camera disposed under the first display area 10.

Furthermore, a material of the conductive layer can include at least one of indium tin oxide, indium zinc oxide, silver-doped indium tin oxide, silver-doped indium zinc oxide, zinc oxide, aluminum-doped zinc oxide, and gallium-doped zinc oxide.

Figure 14:
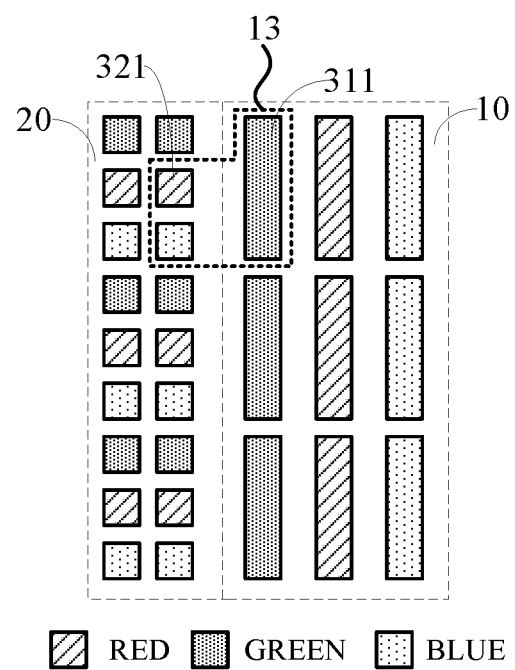
FIG. 14 is a partial schematic view of an embodiment illustrating an arrangement of the first sub-pixels in the first display area and second sub-pixels in a second display area in the display substrate shown in FIG. 1.

In an embodiment, referring to FIG. 14, the number of colors of the first sub-pixels 311 provided in the first display area 10 is n, and the number of colors of the second sub-pixels 321 provided in the second display area 20 is n, where n is a natural number and not less than 3. The distribution density of the first sub-pixels 311 in the first display area 10 is smaller than the distribution density of the second sub-pixels 321 in the second display area 20.

The first sub-pixel 311 of a first color group in the first display area 10, which is adjacent to the second display area 20, and the second sub-pixel 321 of a second color group in the second display area 20, which is adjacent to the first sub-pixel 311 of the first color group, constitute a transition pixel unit 13. The number of colors included in the first color group is m1, where m1∈[1,n−1]. The number of colors included in the second color group is m2, where m2=n−m1. Types of colors in the first color group are different from types of colors in the second color group.

In an embodiment, the first color group can include one or more colors, and the second color group can include one or more colors.

In a displayed result of the display substrate shown in FIG. 14, the first color group includes one color, and the color is green; the second color group includes two colors, and the colors are red and blue. The first sub-pixel 311 of the first color group in the first display area 10, which is adjacent to the second display area 20, and the second sub-pixels 321 of the second color group in the second display area 20 constitute the transition pixel unit 13, so that the first sub-pixel 311 and the second sub-pixels 321 in the transition pixel unit 13 can serve as one pixel unit to emit light. In this case, when the transition pixel unit 13 is controlled to emit light, the first sub-pixel 311 and the second sub-pixels 321 in the transition pixel unit 13 can emit light together, thereby increasing brightness at a border of the first display area 10 and the second display area 20, making a black line formed at the border not to be easily observed, and improving the user's viewing effect. If colors of adjacent sub-pixels in the first display area 10 and the second display area 20 are the same, when the display substrate 100 displays a white picture, because the light of the same color is emitted at the border of the first display area 10 and the second display area 2, a problem that the white picture cannot be displayed in the region at the border of the first display area 10 and the second display area 2 will occur. The present disclosure can further avoid this problem, thereby improving the users' experience.

Based on a different pixel arrangement from the embodiment shown in FIG. 14, the first sub-pixel of the first color group in the first display area 10, which is adjacent to the second display area 20, can have more than one color, therefore, in addition to including one first sub-pixel shown in FIG. 14, the transition pixel unit can also include multiple first sub-pixels. Certainly, in addition to including multiple second sub-pixels shown in FIG. 14, the transition pixel unit can also include only one second sub-pixel. It should be noted that, in addition to the above-mentioned colors, such as red, green and blue, the multiple colors can also be cyan, magenta and yellow; and can also be red, green, blue and white. The types and numbers of colors of the multiple colors are not limited in the embodiments of the present disclosure, and can be specifically selected as required.

During a display, the first sub-pixel in the transition pixel unit is a multiplexing sub-pixel of the transition pixel unit and the first pixel unit. In an embodiment, during a display performed by the transition pixel unit, the first sub-pixels and the second sub-pixels in the transition pixel unit can be controlled to turn on; during a display performed by the first pixel unit, the first sub-pixel in the transition pixel unit, and the first sub-pixel in the first pixel unit, which has a same color as in the second color group can be controlled to turn on, so that during a display, the multiplexing sub-pixel can be used by the transition pixel unit or the first pixel unit.

Furthermore, the first sub-pixel in the transition pixel unit, and the first sub-pixel in the first display area, which has a same color as in the second color group and is proximate to the first sub-pixel in the transition pixel unit, form one or more first pixel units. Such an arrangement can increase the number of pixel units per unit area to a certain extent, which is conducive to improvement of the display effect.

The first sub-pixel in the transition pixel unit can be a multiplexing sub-pixel used by the transition pixel unit or the pixel unit in the first display area during a display. Or, the first sub-pixel in the transition pixel unit is an isolated sub-pixel in the first display area, and the isolated sub-pixel and other first sub-pixels in the first display area cannot form a complete first pixel unit.

An embodiment of the present disclosure also provides a display panel, which includes the above-mentioned display substrate and a package structure.

In an embodiment, the package structure includes a polarizer, and the polarizer covers at least the second display area. In one of the embodiments, the polarizer does not cover the first display area, and a photosensitive device that emits or collects light through the first display area can be disposed under the first display area. The polarizer can dissipate reflected light on a surface of the display panel, thereby improving the users' experience. No polarizer is provided in the first display area, which can increase the light transmittance of the first display area and ensure a normal operation of the photosensitive device disposed under the first display area.

An embodiment of the present disclosure further provides a display device, which includes a device body and the above-mentioned display panel. The device body has a component area, and the display panel covers the device body. The component area is disposed under the first display area, and photosensitive devices are arranged in the component area to collect light passing through the first display area.

The photosensitive devices can include a camera and/or a light sensor. The component area can also be provided with other devices other than the photosensitive devices, such as a gyroscope or an earpiece. The component area may be a notched area, and the first display area of the display panel can be disposed corresponding to the notched area and fits the notched area, so that the photosensitive devices can emit or collect light through the first display area.

The above-mentioned display device may be a digital device such as a mobile phone, a tablet, a palm computer, or an iPod.

Those skilled in the art can easily think of other embodiments of the present disclosure after considering the specification and implementing the solutions disclosed herein. The present disclosure is intended to cover any variations, purposes, or adaptive changes of the present disclosure. These variations, purposes, or adaptive changes follow general principles of the present disclosure and include common knowledge or conventional technical means in the technical field which are not disclosed by the present disclosure. The specification and embodiments are merely illustrative, and the true scope of the present disclosure is claimed by the following claims.

It should be understood that the present disclosure is not limited to the precise structure described above and shown in the accompanying drawings, and various modifications and changes can be made without departing from the scope of the present disclosure. The scope of the present disclosure is limited only by the appended claims.

What is claimed is:

1. A display substrate comprising a display area and a frame area surrounding at least part of the display area, wherein
the display area comprises a first display area and a second display area, and a light transmittance of the first display area is greater than a light transmittance of the second display area;
the display area is provided with a plurality of pixel groups comprising a plurality of sub-pixels arranged along a first direction, and the plurality of sub-pixels comprise one or more first sub-pixels and one or more second sub-pixels;
at least one of the plurality of pixel groups comprises a first sub-pixel group disposed in the first display area and a second sub-pixel group disposed in the second display area, and at least another of the plurality of pixel groups only comprises a second sub-pixel group disposed in the second display area;
the first sub-pixel group comprises at least one first sub-pixel; the second sub-pixel group comprises at least one second sub-pixel; when multiple sub-pixels are provided in a same pixel group, the multiple sub-pixels are arranged at intervals along a second direction;
the display area is provided with pixel circuits for driving the sub-pixels; the frame area is provided with one or more emission (EM) signal control circuits, and a number of output terminals of each EM signal control circuit is m, wherein m is an integer greater than 2; and each of the output terminals is electrically connected to at least part of the pixel circuits of the first sub-pixel group and/or the second sub-pixel group.

2. The display substrate according to claim 1, wherein the first sub-pixel group comprises two first sub-pixels, and each of the first sub-pixels is provided with a pixel circuit;
the frame area comprises two sub-frame areas located on two opposite sides of the display area; the two sub-frame areas extend in a third direction; each of the two sub-frame areas is provided with an EM signal control circuit corresponding to the first sub-pixel groups; and the pixel circuit of each first sub-pixel in each of the first sub-pixel groups is electrically connected to the EM signal control circuit in one of the two sub-frame areas, wherein the one of the two sub-frame areas is proximate to the each first sub-pixel.

3. The display substrate according to claim 2, wherein among the first sub-pixels and the second sub-pixels in a same pixel group, one pixel circuit of one second sub-pixel arranged between one first sub-pixel and one sub-frame area proximate to the first sub-pixel, and another pixel circuit of the one first sub-pixel are electrically connected to a same output terminal of a same EM signal control circuit.

4. The display substrate according to claim 1, wherein each of two sub-frame areas is provided with a scanning control circuit, and the pixel circuit of each first sub pixel in the first sub-pixel group is electrically connected to the scanning control circuit in one sub-frame area proximate to the corresponding first sub-pixel; and
among the first sub-pixels and the second sub-pixels in a same pixel group, one pixel circuit of one second sub-pixel arranged between one first sub-pixel and one sub-frame area proximate to the first sub-pixel, and another pixel circuit of the one first sub-pixel are electrically connected to a same scanning control circuit.

5. The display substrate according to claim 1, wherein the first sub-pixel group comprises one first sub-pixel, and the first sub-pixel is provided with one pixel circuit;
the frame area comprises two sub-frame areas located on two opposite sides of the display area, the two sub-frame areas extend in a third direction, and one of the two sub-frame areas is provided with one EM signal control circuit corresponding to the first sub-pixel group; and
the pixel circuit of the first sub-pixel in the first sub-pixel group is electrically connected to an output terminal of the corresponding EM signal control circuit.

6. The display substrate according to claim 5, wherein the pixel circuit of the first sub-pixel and the pixel circuit of the second sub-pixel are connected to a same output terminal of a same EM signal control circuit, wherein, the first sub-pixel and the second sub-pixel are in a same pixel group.

7. The display substrate according to claim 1, wherein the first sub-pixel group comprises one first sub-pixel, and the first sub-pixel is provided with two pixel circuits;
the frame area comprises two sub-frame areas located on two sides opposite to each other of the display area; the two sub-frame areas extend in a third direction; each of the two sub-frame areas is provided with an EM signal control circuit corresponding to the first sub-pixel group; the two pixel circuits of the first sub-pixel in the first sub-pixel group are electrically connected to two EM signal control circuits one-to-one; and in a same pixel group, the pixel circuit of the second sub-pixel between the first display area and any one sub-frame area, and the pixel circuit of the first sub-pixel proximate to the one sub-frame area, are connected to a same output terminal of the EM signal control circuit in the one sub-frame area.

8. The display substrate according to claim 1, wherein the second display area comprises a first area and a second area; the second area is adjacent to the first area and the first display area; the second area surrounds at least part of the first display area; and the pixel circuit of the first sub-pixel in the first sub-pixel group is disposed in the second area.

9. The display substrate according to claim 8, wherein the first sub-pixel group comprises two first sub-pixels; and each of the two first sub-pixels is provided with one pixel circuit, and the pixel circuit of each first sub-pixel is disposed in a region of the second area, which is proximate to the each first sub-pixel.

10. The display substrate according to claim 8, wherein the first sub-pixel group comprises one first sub-pixel, and the first sub-pixel is provided with one pixel circuit; and the pixel circuit of the first sub-pixel in the first sub-pixel group is disposed in a region of the second area, which is located on either side of the first sub-pixel.

11. The display substrate according to claim 8, wherein the first sub-pixel group comprises one first sub-pixel, the first sub-pixel is provided with two pixel circuits, and the two pixel circuits of the first sub-pixel are respectively disposed in two regions of the second area, which are located on two sides of the first sub-pixel; and a distribution density of the second sub-pixels in the second area is greater than a distribution density of the first sub-pixels in the first display area, and less than a distribution density of the second sub-pixels in the first area.

12. The display substrate according to claim 1, wherein a distribution density of the first sub-pixels in the first display area is less than a distribution density of the second sub-pixels in the second display area; and in a same pixel group, a first directional dimension of the first sub-pixel is greater than a first directional dimension of the second sub-pixel; the second display area further comprises at least one third sub-pixel group disposed between two adjacent second sub-pixel groups; the third sub-pixel group comprises at least one second sub-pixel, and when the third sub-pixel group comprises a plurality of the second sub-pixels, the plurality of the second sub-pixels are arranged at intervals and spaced by the first sub-pixel group along the second direction.

13. The display substrate according to claim 12, wherein the frame area comprises two sub-frame areas located on two opposite sides of the display area; two sub-frame areas extend in a third direction; and among the second sub-pixels in the third sub-pixel group and the second sub-pixels in one second sub-pixel group adjacent to the third sub-pixel group, pixel circuits of second sub-pixels in the one second sub-pixel group, which are arranged between one of the two sub-frame areas and the first display area, and pixel circuits of second sub-pixels in the third sub-pixel group, which are arranged between the one of the two sub-frame areas and the first display area, are electrically connected to a same output terminal of a same EM signal control circuit, or connected to different output terminals of the same EM signal control circuit.

14. The display substrate according to claim 1, wherein the first sub-pixel comprises a first electrode, a first light-emitting structure block disposed on the first electrode, and a second electrode disposed on the first light-emitting structure block;

the first electrode of each first sub-pixel comprises two or more first electrode blocks and a connecting portion disposed between two adjacent first electrode blocks, and the two adjacent first electrode blocks are electrically connected through the connecting portion; among the first electrode blocks of the first sub-pixels in a same first sub-pixel group, two adjacent first electrode blocks are staggered in the second direction; and the second direction is perpendicular to the first direction.

15. The display substrate according to claim 14, wherein the display substrate comprises a substrate, and the first electrode block is disposed on the substrate; a projection of the first electrode block on the substrate consists of one or more first graphic units; the first graphic unit is a circle, an ellipse, dumbbell-shaped, gourd-shaped or a rectangle;

a projection of the first light-emitting structural block on the substrate comprises one or more second graphic units, which are identical to or different from the first graphic unit;

the first electrode and the second electrode are transparent materials; and a light transmittance of the transparent material is greater than or equal to 70%.

16. The display substrate according to claim 1, wherein the frame area is further provided with a low-level power signal line; each first sub-pixel in the first sub-pixel group comprises a first electrode, a first light-emitting structural block disposed on the first electrode, and a second electrode disposed on the first light-emitting structural block;

the second sub-pixel in the second sub-pixel group comprises a third electrode, a second light-emitting structural block disposed on the third electrode, and a fourth electrode disposed on the second light-emitting structural block; the second electrode in the first display area and the fourth electrode in the second display area are connected to form a planar electrode; and the first display area adjoins the frame area; the low-level power signal line surrounds at least part of the display area; the low-level power signal line and the planar electrode are bridged by a conductive layer; a material of a partial conductive layer adjacent to the first display area is a transparent conductive material, or an area of the frame area adjacent to the first display area is not provided with the low-level power signal line.

17. The display substrate according to claim 1, wherein a distribution density of the first sub-pixels in the first display area is less than a distribution density of the second sub-pixels in the second display area;

a number of colors of the first sub-pixels in the first display area is n, and a number of colors of the second sub-pixels in the second display area is n, wherein n is a natural number not less than 3;

wherein the first sub-pixel of a first color group in the first display area, which is adjacent to the second display area, and the second sub-pixel of a second color group in the second display area, which is adjacent to the first sub-pixel with the first color group, constitute a transition pixel unit; and a number of colors in the first color group is m1, wherein $m1 \in [1, n-1]$, and a number of colors in the second color group is m2, wherein m2=n−m1; color types of the first color group are different from color types of the second color group.

18. The display substrate according to claim 17, wherein the first sub-pixel in the transition pixel unit, and the first sub-pixel in the first display area, which has a same color as in the second color group and is proximate to the first sub-pixel in the transition pixel unit, constitute one or more first pixel units;
wherein during a display, the first sub-pixel in the transition pixel unit is a multiplexing sub-pixel used by the transition pixel unit and the first pixel unit in the first display area; or,
the first sub-pixel in the transition pixel unit is an isolated sub-pixel in the first display area; and the isolated sub-pixel and other first sub-pixels in the first display area cannot form a complete first pixel unit.

19. A display panel, comprising:
a package structure; and
a display substrate, the display substrate comprising a display area and a frame area surrounding at least part of the display area,
wherein
the display area comprises a first display area and a second display area, and a light transmittance of the first display area is greater than a light transmittance of the second display area;
the display area is provided with a plurality of pixel groups comprising a plurality of sub-pixels arranged along a first direction, and the plurality of sub-pixels comprise one or more first sub-pixels and one or more second sub-pixels;
at least one of the plurality of pixel groups comprises a first sub-pixel group disposed in the first display area and a second sub-pixel group disposed in the second display area, and at least another of the plurality of pixel groups only comprises a second sub-pixel group disposed in the second display area;
the first sub-pixel group comprises at least one first sub-pixel; the second sub-pixel group comprises at least one second sub-pixel; when multiple sub-pixels are provided in a same pixel group, the multiple sub-pixels are arranged at intervals along a second direction;
the display area is provided with pixel circuits for driving the sub-pixels; the frame area is provided with one or more emission (EM) signal control circuits, and a number of output terminals of each EM signal control circuit is m, wherein m is an integer greater than 2; and each of the output terminals is electrically connected to at least part of the pixel circuits of the first sub-pixel group and/or the second sub-pixel group;
wherein the package structure comprises a polarizer, which covers at least the second display area, and the polarizer does not cover the first display area.

20. A display device, comprising: a device body having a component area; and
a display panel, the display panel covering the device body, the display panel comprising a package structure and a display substrate, the display substrate comprising a display area and a frame area surrounding at least part of the display area;
wherein
the display area comprises a first display area and a second display area, and a light transmittance of the first display area is greater than a light transmittance of the second display area;
the display area is provided with a plurality of pixel groups comprising a plurality of sub-pixels arranged along a first direction, and the plurality of sub-pixels comprise one or more first sub-pixels and one or more second sub-pixels;
at least one of the plurality of pixel groups comprises a first sub-pixel group disposed in the first display area and a second sub-pixel group disposed in the second display area, and at least another of the plurality of pixel groups only comprises a second sub-pixel group disposed in the second display area;
the first sub-pixel group comprises at least one first sub-pixel; the second sub-pixel group comprises at least one second sub-pixel; when multiple sub-pixels are provided in a same pixel group, the multiple sub-pixels are arranged at intervals along a second direction;
the display area is provided with pixel circuits for driving the sub-pixels; the frame area is provided with one or more emission (EM) signal control circuits, and a number of output terminals of each EM signal control circuit is m, wherein m is an integer greater than 2; and each of the output terminals is electrically connected to at least part of the pixel circuits of the first sub-pixel group and/or the second sub-pixel group;
the package structure comprises a polarizer, which covers at least the second display area, and the polarizer does not cover the first display area;
wherein the component area is disposed under the first display area, and the component area is provided with a photosensitive device that emits or collects light passing through the first display area.

* * * * *